(12) United States Patent
Mozdzen

(10) Patent No.: US 6,493,935 B1
(45) Date of Patent: Dec. 17, 2002

(54) INTERLEAVING A BONDWIRE BETWEEN TWO BONDWIRES COUPLED TO A SAME TERMINAL

(75) Inventor: Thomas J. Mozdzen, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/532,130

(22) Filed: Mar. 21, 2000

Related U.S. Application Data (62) Division of application No. 08/998,180, filed on Dec. 24, 1997, now Pat. No. 6,051,890.

(51) Int. Cl.[7] .............................................. H01K 3/10
(52) U.S. Cl. .......................... 29/852; 29/825; 29/832; 29/846; 228/180.1; 228/180.22
(58) Field of Search ...................... 29/840, 841, 825, 29/832, 827, 846; 228/179.1, 180.1, 180.22

(56) References Cited

U.S. PATENT DOCUMENTS

| | | | | |
|---|---|---|---|---|
| 4,417,392 A | * | 11/1983 | Ibrahim et al. ............... | 29/840 |
| 5,072,519 A | * | 12/1991 | Mase ........................... | 29/840 |
| 5,156,983 A | * | 10/1992 | Schlesinger et al. | |
| 5,177,863 A | * | 1/1993 | Lam ............................ | 29/840 |
| 5,206,986 A | * | 5/1993 | Arai et al. .................... | 29/840 |
| 5,355,283 A | | 10/1994 | Marrs et al. ................ | 361/760 |
| 5,396,701 A | * | 3/1995 | Russell ........................ | 29/840 |
| 5,490,324 A | | 2/1996 | Newman ..................... | 29/830 |
| 5,604,161 A | * | 2/1997 | Barber ......................... | 29/840 |
| 5,640,048 A | | 6/1997 | Selna .......................... | 257/738 |
| 5,787,575 A | * | 8/1998 | Banjeree et al. .............. | 29/840 |
| 5,798,571 A | | 8/1998 | Nakajima ................... | 257/784 |

* cited by examiner

Primary Examiner—Carl J. Arbes
(74) Attorney, Agent, or Firm—Cynthia T. Faatz (57) ABSTRACT

An integrated circuit device package. A substrate includes a first terminal coupled to the substrate. First and second conductive traces are formed on the substrate and are electrically coupled to the first terminal wherein the first conductive trace is provided to electrically couple a first bondwire to the first terminal and the second conductive trace is provided to electrically couple the second bondwire to the first terminal.

21 Claims, 5 Drawing Sheets

INTERLEAVING A BONDWIRE BETWEEN TWO BONDWIRES COUPLED TO A SAME TERMINAL

This is a division of application Ser. No. 08/998,180, filed Dec. 24, 1997, now U.S. Pat. No. 6,051,890.

FIELD OF THE INVENTION

The present invention relates generally to the field of integrated circuit device packages, and more particularly, to connections between an integrated circuit die and terminal(s) on an integrated circuit device package.

BACKGROUND OF THE INVENTION

While integrated circuit devices continue to increase in complexity, keeping costs low and form factors small is still a focus for many applications. A key factor in determining the cost and space taken up by a particular integrated circuit device can be the package in which the integrated circuit device is provided.

For integrated circuit devices such as microprocessor chipsets, for example, that are particularly cost- and space-sensitive, a relatively small plastic package having a dense input/output terminal pattern may be used. Ball grid array (BGA) packages, for example, are increasingly popular because they are capable of providing a dense terminal array in a relatively small area at a relatively low cost.

"Terminals" as the term is used herein, refers to external, electrically conductive features provided on a package for transferring signals to and from the integrated circuit die within the package. Types of terminals include pins, solder balls, polymer balls coated with a conductive material, solder columns, land pads, etc. The type of terminal depends on the type of package being used.

To transfer signals to and from an integrated circuit die within a package, bondwires may be used to electrically connect bondpads on the integrated circuit die to bondfingers or bondposts on a package substrate. Individual traces and vias on the package substrate electrically couple the bondfingers to the respective terminals that provide the input/output connections for the package.

The routing of electrical connections from bondpads on the integrated circuit die to the package terminals presents several challenges for integrated circuit package designers. In particular, there may be more bondpads on the integrated circuit die (or bondwires from the integrated circuit die to the package substrate) than there are available terminals on the package. This circumstance may arise, for example, where multiple power and/or ground connections to the integrated circuit die are provided. Multiple power and/or ground connections are desirable in many cases to improve the quality and strength of the signals transmitted to and from an integrated circuit die.

Figure 1:
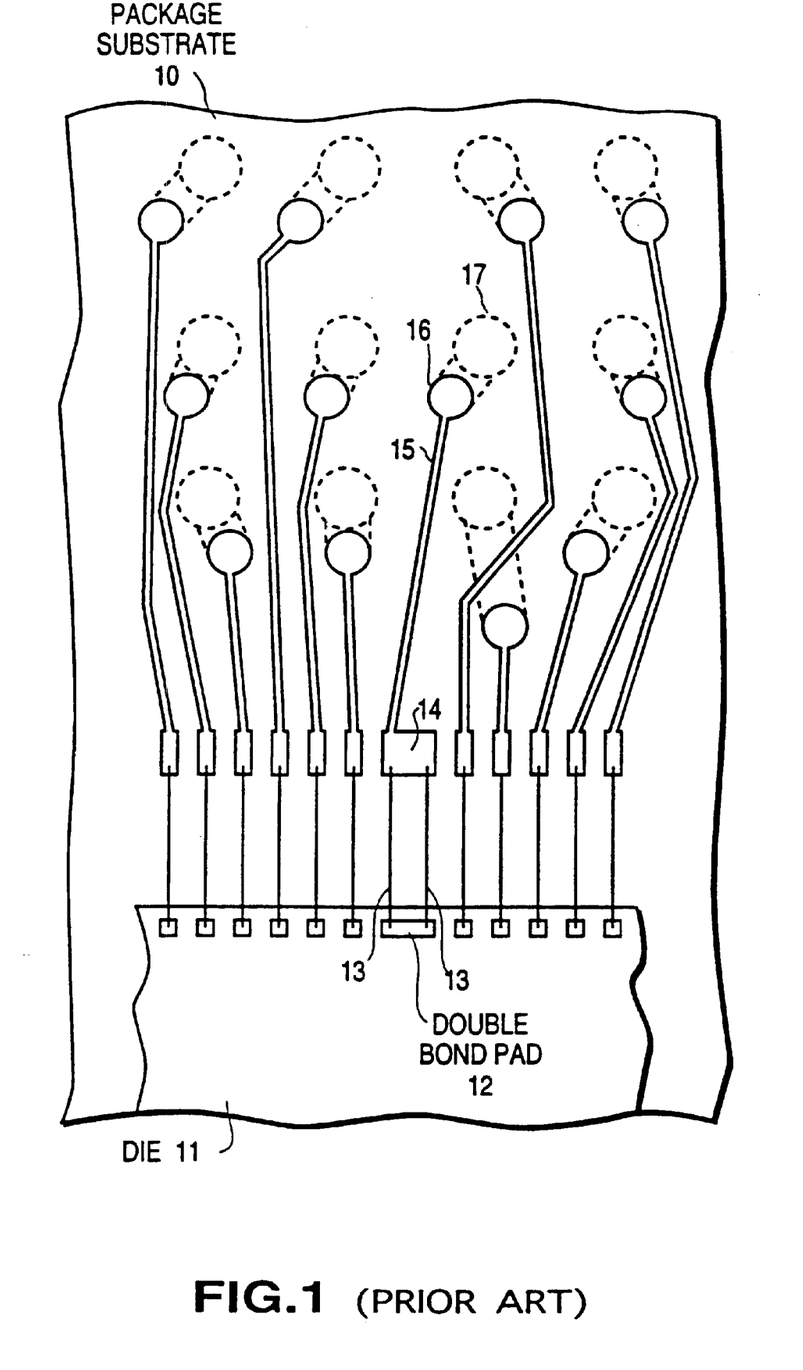
FIG. 1 is a partial top down view of a package substrate, semiconductor die and conductive traces of a prior integrated circuit device package.

One approach to addressing this issue is illustrated in FIG. 1. FIG. 1 is a top view of a portion of a package substrate 10 having an integrated circuit die 11 mounted thereon. The integrated circuit die 11 includes a double bondpad 12 and two bondwires 13 extending from the bondpad 12 to a double bondfinger 14. The double bondfinger 14 is electrically connected to a single conductive trace 15 extending to a single via 16. The via 16 is electrically connected by a conductive trace on another layer or surface of the substrate 10 to a single power terminal 17 (shown in phantom). The power terminal 17 is coupled to an underside of the package substrate 10. In this manner, the package substrate 10 of FIG. 1 provides for multiple power connections to a single power terminal 17 such that the number of bondpads on the die 11 may be greater than the number of available terminals.

A disadvantage of this approach, however, is that while a ground connection may be provided on either side of the double power connection, a ground bondwire or other ground connection cannot be provided between the two power bondwires 13. Lack of a ground connection between the two power bondwires 13 of FIG. 1 can cause the inductance of the combined power connection to be undesirably high. High inductance can adversely affect device performance.

Further, different types of bondwires and/or integrated circuit device packages including substrates that are different than the substrate 10 of FIG. 1 that have dense terminal layouts may present similar issues.

SUMMARY OF THE INVENTION

An integrated circuit device package includes a substrate including a first terminal coupled to the substrate. First and second conductive traces are formed on the substrate and electrically coupled to the first terminal, wherein the first conductive trace is to couple a first bondwire to the first terminal and the second conductive trace is to couple a second bondwire to the first terminal.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and which.

DETAILED DESCRIPTION

An integrated circuit device package that enables an increase in the number of bondwires without a corresponding increase in the number of terminals, and method for constructing the same are described. Although the embodiments described below refer to a ball grid array (BGA) package for purposes of illustration, other types of integrated circuit device packages such as column grid arrays, for example, may also be used in accordance with various embodiments.

An intended advantage of one or more embodiments is to electrically couple two or more bondwires to a single terminal while enabling a bondwire that is electrically coupled to another terminal to be interleaved between the two bondwires. In this manner, integrated circuit package designers are provided with more flexibility for routing connections from an integrated circuit die to package terminals. More specifically, an intended advantage of one or more embodiments is to enable a ground bondwire that is electrically coupled to a ground terminal to be interleaved between two power bondwires that are electrically coupled to a single power terminal. Other advantages will be appreciated from the description that follows.

Figure 2:
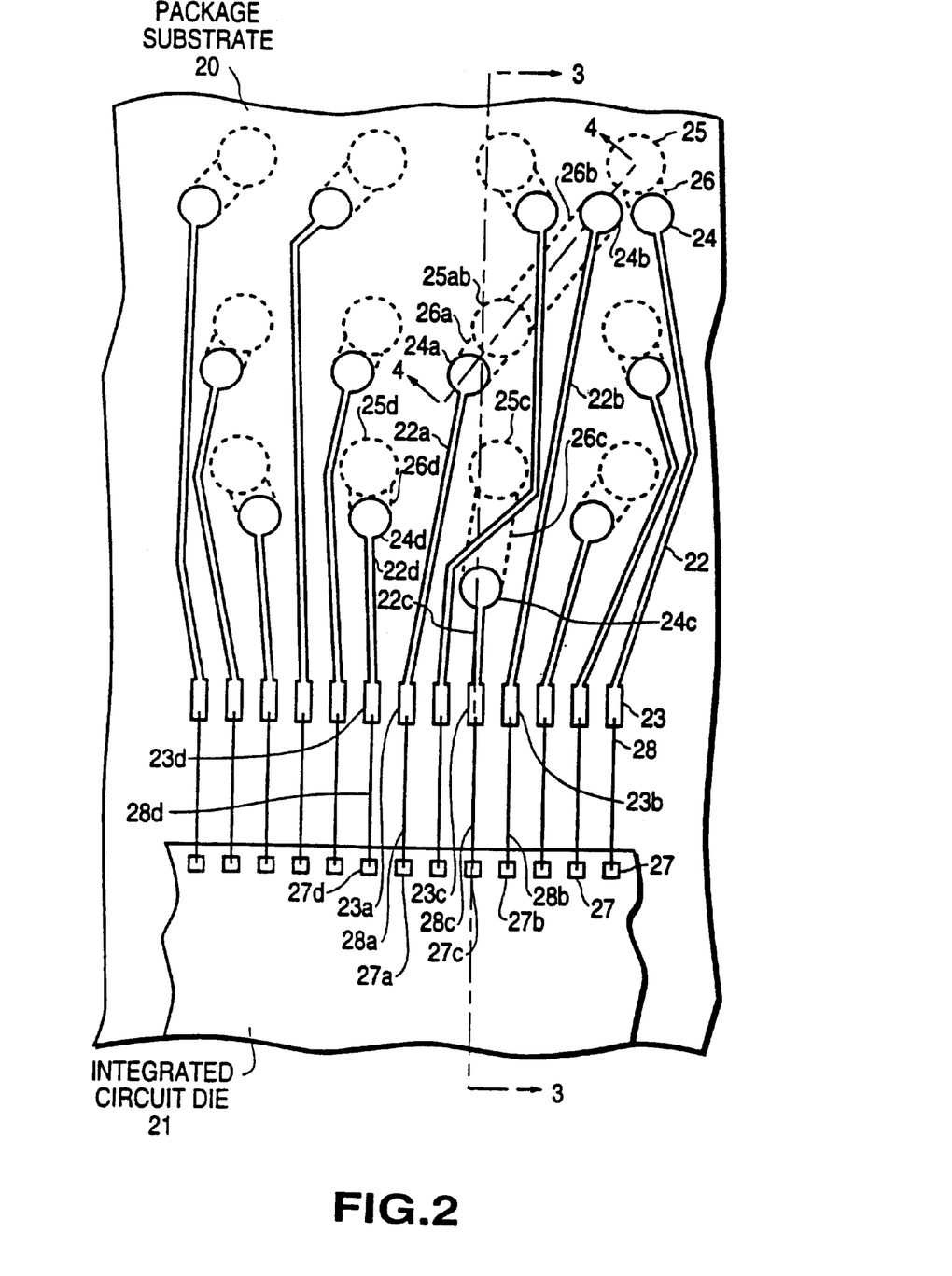
FIG. 2 is a partial top down view of a package substrate, semiconductor die and arrangement conductive traces of one embodiment.

FIG. 2 shows a partial top down view of a package substrate 20 on which an integrated circuit die 21 is mounted. The package substrate 20 is part of a ball grid array (BGA) package for this example, however, other substrates that are used with different types of packages may also be used in accordance with the invention.

Figure 3:
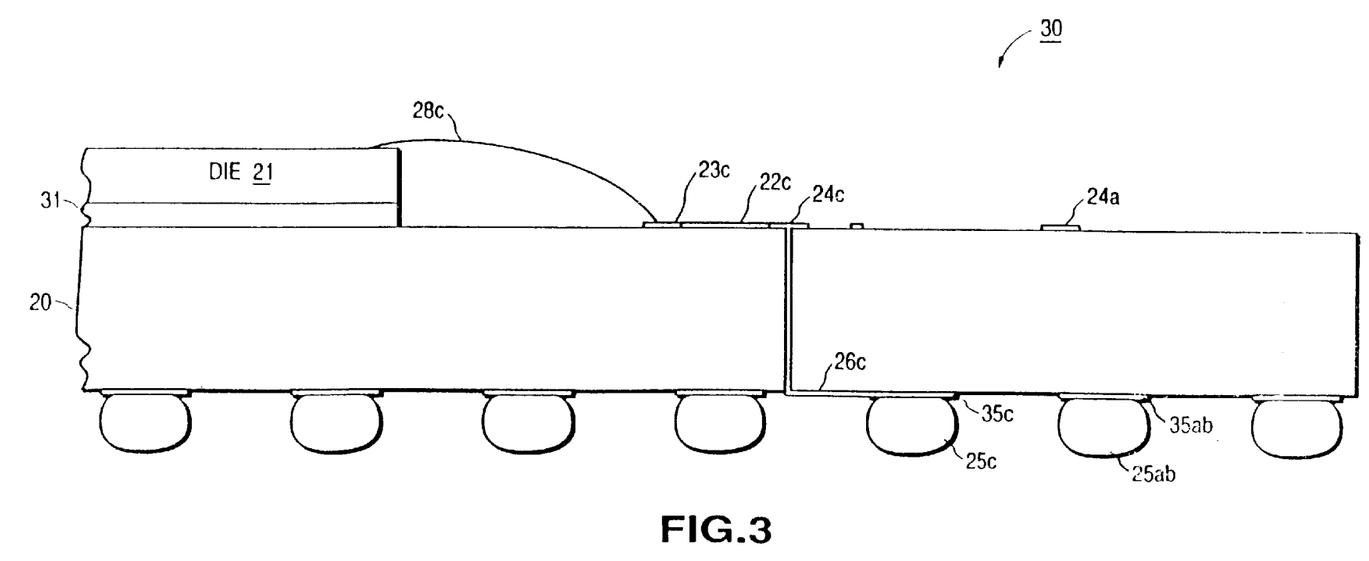
FIG. 3 is a partial cross-sectional view of the package substrate, semiconductor die and conductive traces of FIG. 2 taken along the line 3—3.
Figure 4:
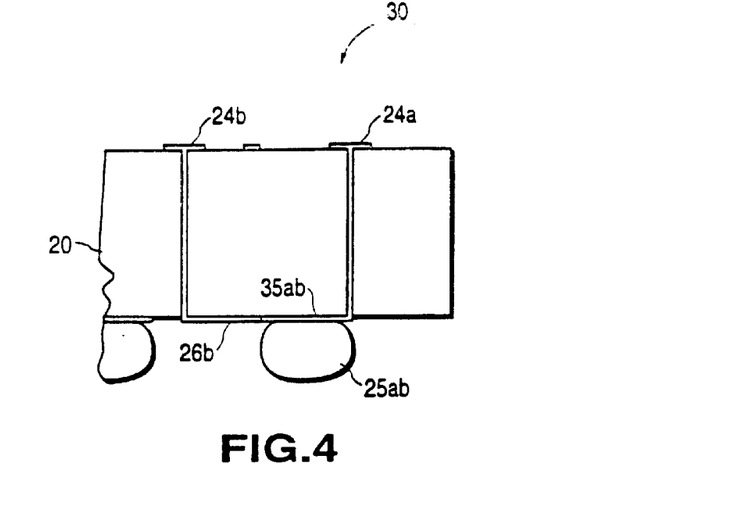
FIG. 4 is a partial cross-sectional view of the package substrate of FIG. 2 taken along the line 4—4 showing the manner in which the first and second conductive traces are electrically coupled to a single terminal.

The package substrate 20 of one embodiment is formed of an insulator material such as an epoxy-glass resin as shown in more detail in FIGS. 3 and 4. For other embodiments, the package substrate may be formed of another substrate material.

The integrated circuit die 21 coupled to the package substrate 20 includes bondpads 27. The bondpads 27 are contact areas on the integrated circuit die 21 through which signals are transferred to and from the integrated circuit die 21 during operation.

Each of the bondpads 27 is electrically connected to a corresponding bondfinger 23, and thus, to a corresponding conductive trace 22, by a bondwire 28. The bondwires 28 may be formed of gold or another low resistance, electrically conductive material. The process of electrically connecting a bondpad 27 to a corresponding bondfinger 23 with a bondwire 28 is often referred to as "bonding out" the bondpad to the bondfinger (or to the corresponding conductive trace).

For other embodiments, some of the bondpads, in particular the ground bondpads, may be bonded out to a conductive area other than a bondfinger. This conductive area may be a ground paddle, for example, that extends from, beneath the integrated circuit die. In this case, the bondpads are "downbonded" to the ground paddle. Other types of conductive structures to which wires can be bonded can also be used for alternative embodiments.

The package substrate 20 includes conductive traces 22 on a first surface of the package substrate 20, each of which has a bondfinger 23 at one end and includes a conductive via 24 that may be at the opposite end of the conductive trace 22. The bondfingers 23 of this embodiment are slightly wider areas of the conductive traces 22 that provide for bonding out of the integrated circuit die 21 to the conductive traces 22. It will be appreciated that conductive traces of other embodiments may not include bondfingers at one end, may extend beyond the vias or may be configured in a different manner than shown in FIG. 2.

Each of the vias 24 electrically couples the corresponding conductive trace 22 to a terminal 25 (shown in phantom) on an external surface of the package substrate 20. The vias 24 extend through the package substrate 20 and are each electrically coupled directly to one of the terminals 25 or indirectly by an intermediate conductive trace 26 (also shown in phantom in FIG. 2) on another surface of the package substrate 20. The conductive traces 26 are referred to herein as intermediate conductive traces. Some of the intermediate conductive traces 26 may extend beneath the integrated circuit die 21 to reach terminals that are located beneath the integrated circuit die (not shown). Also, for other embodiments, the layout of the vias 24 may be different than the arrangement shown in FIG. 2. The manner in which the vias 24 and the conductive traces 26 are coupled to the terminals 25 is shown in more detail in FIGS. 3 and 4.

The conductive traces 22 and bondfingers 23 of one embodiment are formed using conventional lithographic techniques. For example, the conductive traces 22 and bondfingers 23 may be formed of copper that is deposited on the substrate, patterned, etched and plated with gold and/or nickel. The conductive traces 22 and bondfingers 23 may be patterned and formed simultaneously such that the bondfingers 23 are an integral part of the conductive traces 22. Alternatively, the bondfingers 23 and conductive traces 22 may be formed separately, but in a manner such that corresponding conductive traces 22 and bondfingers 23 are electrically continuous. Also, for another embodiment, the conductive traces 22 and bondfingers 23 may be formed of different materials using a different process.

Now with reference to specific elements described generally above, the bondpads 27 include bondpads 27a–d. The bondpads 27a and 27b for this example are both power bondpads, i.e. bondpads to which a supply voltage is to be applied during operation. The bondpad 27c (located between the bondpads. 27a and 27b) and the bondpad 27d (located adjacent to the bondpad 27a) are ground bondpads that each receive a ground signal during operation.

Bondwires 28a–d electrically connect bondpads 27a–d to bondfingers 23a–d, respectively, and thus, to conductive traces 22a–d. The bondwires 28a and 28b are referred to as power bondwires as they are each coupled to transfer a supply voltage to the power bondpads as described below. Similarly, the bondwire 28c (located between the bondwires 28a and 28b) and the bondwire 28d (located adjacent to the bondwire 28a), are referred to as ground bondwires as they are coupled to transfer a ground supply to the ground bondpads 28c and 28d.

The bondfinger 23c corresponding to the bondwire 28c is located between bondfingers 23a and 23b, while the bondfinger 23d is located adjacent to the bondfinger 23a. Similarly, the conductive trace 22c corresponding to the bondwire 28c is located between conductive traces 22a and 22b, while the conductive trace 22d is located adjacent to the conductive trace 22a.

The conductive trace 22a is electrically coupled to a power terminal 25ab by the conductive via 24a and intermediate conductive trace 26a. The conductive trace 22b is also electrically coupled to the power terminal 25ab by the via 24b and intermediate conductive trace 26b. Similarly the conductive traces 22c and 22d are electrically coupled to the ground terminals 25c and 25d, respectively by vias 24c and 24d and conductive traces 26c and 26d, respectively.

The manner in which the conductive traces 22a through 22c are coupled to terminals 25 on the package substrate 20 is described in more detail with reference to FIGS. 3 and 4.

FIG. 3 shows a cross-section of a ball grid array package 30 including the package substrate 20 and integrated circuit die 21 of FIG. 2 taken at the line 3—3. For one embodiment, the die 21 is attached to the package substrate 20 by die attach material 31. The terminals 25 are provided on a bottom surface of the package substrate 20 to transfer signals to and from the integrated circuit die 21 when it is coupled to a printed circuit board in a system, for example. While the terminals 25 of FIG. 3 are solder balls, other types of terminals such as conductor-coated polymer balls, solder columns, land pads or pins may be used for other embodiments. Further, the package substrate for other embodiments may include multiple layers.

The bondwire 28c that electrically connects the bondpad 27c to the bondfinger 23c (FIG. 2) and thus, to the conductive trace 22c is shown in FIG. 3. Also, as shown in FIG. 3, the conductive trace 22c extends across a top surface of the package substrate 20 to the via 24c. The via 24c electrically connects the conductive trace 22c to the intermediate conductive trace 26c that extends across a bottom surface of the package substrate 20. (The intermediate conductive trace 26c is shown in phantom in FIG. 2). The intermediate conductive trace 26c electrically couples the via 24c to a conductive terminal pad 35c between the ground terminal 25c and the package substrate 20. The ground terminal 25c is formed on and electrically coupled to the terminal pad 35c. In this manner, the conductive trace 22c is electrically coupled to the ground terminal 25c.

The ground terminal 25c as well as other ground terminals on the package 30 receives a ground supply during operation from a circuit board or other apparatus to which the package 30 is connected. The ground supply is then provided to the ground bondpad 27c of FIG. 2 by way of the conductive trace 22c and the bondwire 28c.

FIG. 3 also shows the via 24a above the power terminal 25ab. The via 24a is coupled to the conductive trace 22a. The manner in which the conductive traces 22a and 22b are electrically coupled to the power terminal 25ab is now described with reference to FIG. 4.

The via 24b is coupled to the conductive trace 22b. The via 24b is electrically coupled to the intermediate conductive trace 26b (shown in phantom in FIG. 2) that extends along a bottom surface of the package substrate 20 to a conductive terminal pad 35ab. The conductive terminal pad 35ab is electrically coupled to the power terminal 25ab. In this manner, the conductive trace 22b (FIG. 2) is electrically coupled to the power terminal 25ab.

The conductive trace 22a (FIGS. 2 and 3) is also electrically coupled to the power terminal 25ab by the via 24a that extends through the package substrate 20 to the conductive terminal pad 35ab.

In the manner described above, two power bondwires 28a and 28b are electrically coupled through conductive traces 22a and 22b to a single power terminal 25ab while a ground bondwire 28c and conductive trace 22c coupled to a ground terminal 25c are interleaved between the power connections. The power terminal 25ab is so called because, during operation, it receives a supply voltage through a circuit board or other apparatus to which the package 30 is connected.

Referring back to FIG. 2, the embodiments described herein provide the advantage that two bondwires can be electrically coupled to a single terminal while allowing a third bondwire coupled to a different terminal to be interleaved between the first two bondwires. Specifically for one embodiment, power bondwires 28a and 28b can be electrically coupled to one power terminal 25ab such that the number of power bondwires can be increased without requiring an increase in the number of power terminals. Further, the embodiment shown in FIG. 2 provides for a ground bondwire 28c coupled to a ground terminal to be interleaved between the two power bondwires 28a and 28b that are coupled to the single power terminal 25ab.

Also, another ground bondwire 28d is provided adjacent to the power bondwire 28a for one embodiment. In this manner, ground bondwires 28c and 28d are provided in close proximity to the power bondwires 28a and 28b such that the loop formed by the power to ground circuit can be relatively small. The inductance of the power connections provided by the power bondwires 28a and 28b is therefore reduced as compared to the double power connection of FIG. 1 that does not provide for a ground bondwire to be interleaved between the two power connections.

For another embodiment, a signal bondwire may be interleaved between two power bondwires coupled to the same terminal in a similar manner. Further, any type of bondwire may be interleaved between any two bondwires coupled to a same terminal in accordance with various embodiments. In this manner, it may be possible to reduce the number of terminals provided on an integrated circuit device package without reducing the flexibility of the package or integrated circuit designer in routing connections or placing bondpads, respectively.

Figure 5:
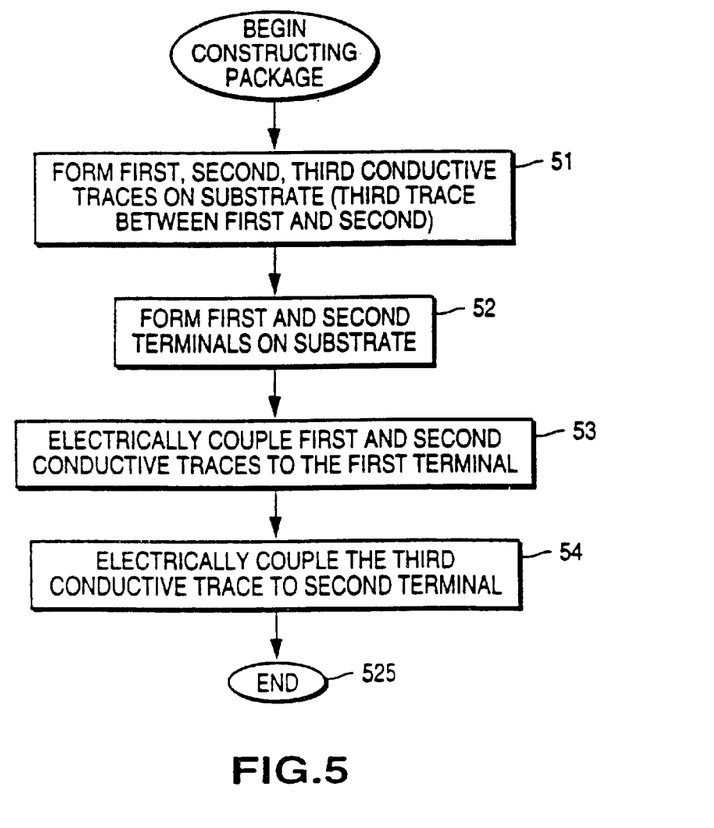
FIG. 5 is a flow diagram showing the package construction method of one embodiment.

The integrated circuit device package construction method of one embodiment is now described with reference to FIG. 5. The steps shown in FIG. 5 may be performed in a different order for different embodiments.

At step 51, first, second and third conductive traces are formed on a package substrate with the third conductive trace being formed between the first and second conductive traces. The conductive traces may be formed on the substrate using conventional lithographic methods, for example. For an alternative embodiment, a third conductive area such as a ground plane is formed in place of the third conductive trace.

A power terminal and a ground terminal are each formed on the package substrate at step 52. At step 53, the first and second conductive traces are electrically coupled to the power terminal and at step 54, the third conductive terminal is electrically coupled to the ground terminal.

Figure 6:
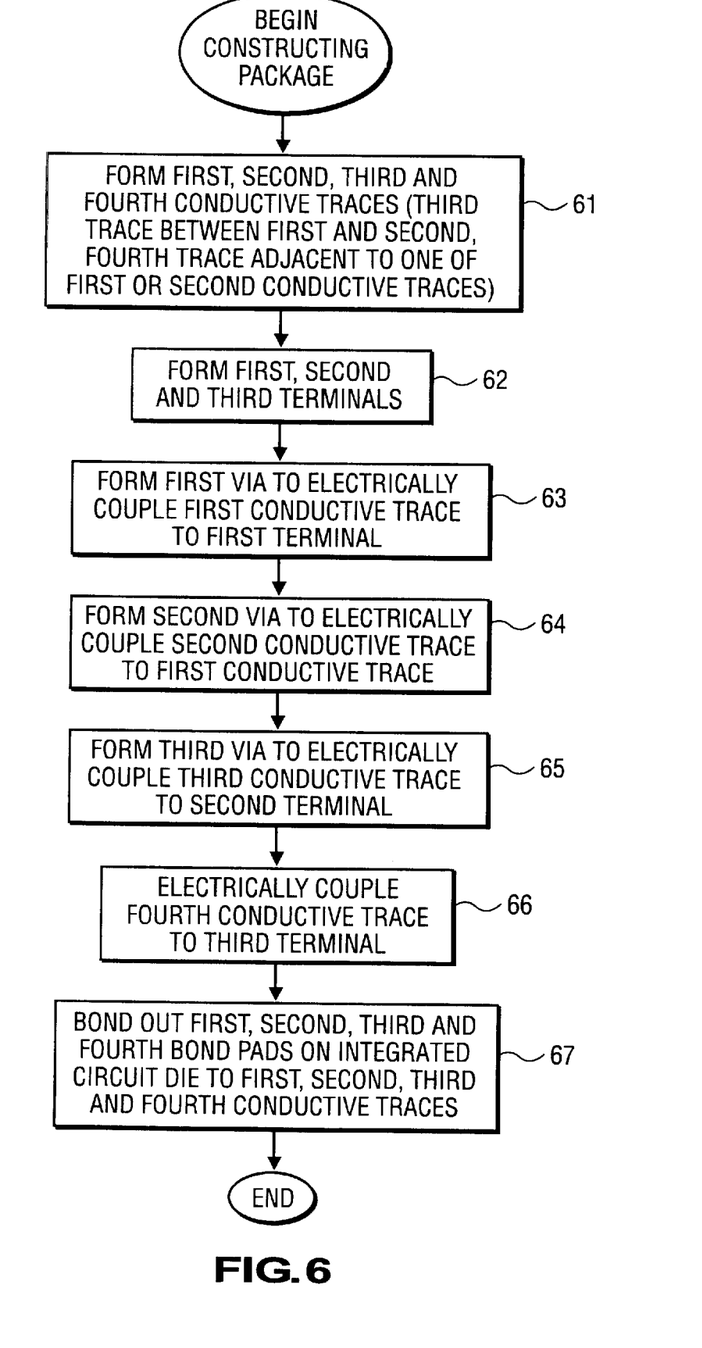
FIG. 6 is a flow diagram showing the package construction method of an alternate embodiment.

FIG. 6 is a flow diagram illustrating the package construction method of another embodiment. The steps provided below may be performed in an order other than that shown in FIG. 6. At step 61, first, second, third and fourth conductive traces are formed. The third conductive trace is formed between the first and second conductive trace, and the fourth conductive trace is formed adjacent to one of the first or second conductive traces. For an alternative embodiment, a conductive area is formed in place of the third conductive trace. The conductive area may not necessarily extend between the first and second conductive traces, but provides for a bondwire connected to the conductive area to be interleaved between the first and second conductive areas.

At step 62, a power terminal and two ground terminals are formed on the substrate. Other terminals may also be formed during this step. For one embodiment, the package is a ball grid array and each of the power and ground terminals is a solder ball or a polymer ball coated with a conductive material. Also, for one embodiment, the power and ground terminals are formed on a side of the substrate opposite the side on which the first through fourth conductive traces are formed.

At step 63, a first via is formed to electrically connect the first conductive trace to the power terminal. A second via is formed at step 64 to electrically connect the second conductive trace to the first conductive trace and/or to the power terminal, and at step 65, a third via is formed to electrically connect the third conductive trace to the first ground terminal. At step 66, the fourth conductive trace is electrically coupled to the second ground terminal by a via or in another manner. The first, second, third and fourth vias may be formed using conventional methods. For example, the vias may be formed by drilling or otherwise forming holes in the substrate and then filling the holes or plating the sidewalls of the holes with a conductive material.

At step 67, first, second and third bondpads on an integrated circuit die are bonded out to the first, second and third conductive traces respectively. A fourth bondpad may also be bonded out the fourth trace. The third bondpad is between the first and second bondpads and the fourth bondpad is adjacent to one of the first or second bondpads. The step of bonding out the bondpads to corresponding traces includes a step of connecting a bondwire from each bondpad to the corresponding conductive trace for one embodiment.

Where a third conductive area is formed instead of the third conductive trace, the step of bonding out may include a step of downbonding the third bondpad to the third conductive area with a third bondwire. For this embodiment, as for the embodiment described above, the third bondwire is between the first and second bondwires and the third bondpad is between the first and second bondpads.

In the foregoing specification, the invention has been described with reference to specific exemplary embodiments thereof. It will, however be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for constructing an integrated circuit device package, the method comprising:
    forming first and second conductive traces on a first surface of a package substrate;
    forming a first terminal on the substrate; and
    electrically coupling the first and second conductive traces to the first terminal, wherein electrically coupling includes
        forming a first via to electrically couple the first conductive trace to the first terminal, and
        forming a second via to electrically couple the second conductive trace to the first terminal and to the first conductive trace.

2. A method for constructing an integrated circuit device package, the method comprising:
    forming first and second conductive traces on a first surface of a package substrate;
    forming a first terminal on the substrate;
    electrically coupling the first and second conductive traces to the first terminal;
    forming a second terminal on the package substrate;
    forming a third conductive trace on the package substrate;
    electrically coupling the third conductive trace to the second terminal;
    providing an integrated circuit device;
    bonding out first and second bondpads, on the integrated circuit device to the first and second conductive traces respectively; and
    bonding out a third bondpad on the integrated circuit device to the third conductive trace formed on the substrate, the third bondpad being between the first and second bondpads.

3. The method of claim 2 wherein:
    said bonding out first and second bondpads includes coupling first and second bondwires between the first and second bondpads and the first and second conductive traces, respectively, and
    said bonding out the third bondpad includes coupling a third bondwire between the third bondpad and the third conductive trace wherein the third bondwire is between the first and second bondwires.

4. A method comprising:
    forming first and second conductive traces on an integrated circuit device package substrate;
    forming a third conductive trace between the first and second conductive traces;
    forming first and second terminals on the substrate;
    electrically coupling the first and second conductive traces to the first terminal; and
    electrically coupling the third conductive trace to the second terminal.

5. The method of claim 4 wherein the substrate includes a first surface and a second surface, the first and second conductive traces are formed on the first surface, and the first and second terminals are formed on the second surface.

6. The method of claim 5 wherein the third conductive trace is formed on the first surface.

7. The method of claim 6 wherein the first conductive trace has a first bondfinger, the second conductive trace has a second bondfinger, and the third conductive trace has a third bondfinger located between the first and second bondfingers.

8. The method of claim 4 further comprising bonding out first, second, and third bondpads of an integrated circuit die to the respective first, second, and third conductive traces.

9. The method of claim 5 wherein the first terminal is a power terminal and the second terminal is a first ground terminal.

10. The method of claim 9 further comprising forming a fourth conductive trace on the first surface of the substrate adjacent one of the first and second conductive traces, forming a second ground terminal on the second surface of the substrate, and electrically coupling the fourth conductive trace to the second ground terminal.

11. A method comprising:
    forming first, second, and third conductive traces on a first surface of an integrated circuit package substrate, wherein the third conductive trace is formed between the first and second conductive traces;
    forming first and second terminals on a second surface of the substrate;
    electrically coupling the first and second conductive traces to the first terminal;
    electrically coupling the third conductive trace to the second terminal;
    attaching an integrated circuit die to the first surface of the substrate, wherein the die has first, second, and third bondpads; and
    electrically coupling the first, second, and third bondpads to the first, second, and third conductive traces, respectively.

12. The method of claim 11 wherein the third bondpad is adjacent to and between the first and second bondpads.

13. The method of claim 12 wherein the first terminal is a power terminal and the second terminal is a ground terminal.

14. A method comprising:
    forming first and second conductive traces on a first outer layer of an integrated circuit device package substrate, the substrate further having a second outer layer and an inner layer between the first and second outer layers;

forming a first terminal and a second terminal on the second outer layer of the substrate;

forming a third conductive trace on one of the inner and outer layers of the substrate;

electrically coupling the first and second conductive traces to the first terminal; and electrically coupling the third conductive trace to the second terminal.

15. The method of claim 14 further comprising electrically coupling first, second, and third bondwires to the first, second, and third conductive traces, respectively, wherein the third bondwire is between the first and second bondwires.

16. The method of claim 15 further comprising attaching an integrated circuit die having first, second and third bondpads to the substrate, the third bondpad being adjacent to and between the first and second bondpads, and electrically coupling first, second, and third bondwires to the first, second, and third bondpads, respectively.

17. The method of claim 14 wherein the first terminal is a power terminal, and the second terminal is a ground terminal.

18. A method comprising:

forming first, second, third and fourth conductive traces on an integrated circuit device package substrate, wherein the third trace is formed between the first and second conductive traces, and wherein the fourth conductive trace is adjacent one of the first and second conductive traces;

forming first, second, and third terminals on the substrate;

forming a first via to electrically couple the first conductive trace to the first terminal;

forming a second via to electrically couple the second conductive trace to the first conductive trace;

forming a third via to electrically couple the third conductive trace to the second terminal;

electrically coupling the fourth conductive trace to the third terminal; and bonding out first, second, third and fourth bondpads of an integrated circuit die to the respective first, second, third, and fourth conductive traces.

19. The method of claim 18 wherein the substrate includes a first surface and a second surface, the first, second, third, and fourth conductive traces are formed on the first surface, and the first, second, and third terminals are on the second surface.

20. The method of claim 18 wherein the first terminal is a power terminal, the second terminal is a first ground terminal, and the third terminal is a second ground terminal.

21. The method of claim 18 wherein:

said bonding out first and second bondpads includes coupling first and second bondwires between the first and second bondpads and the first and second conductive traces, respectively, and said bonding out the third bondpad includes coupling a third bondwire between the third bondpad and the third conductive trace wherein the third bondwire is between the first and second bondwires.

* * * * *

UNITED STATES PATENT AND TRADEMARK OFFICE
CERTIFICATE OF CORRECTION

PATENT NO. : 6,493,935 B1
DATED : December 17, 2002
INVENTOR(S) : Mozdzen

It is certified that error appears in the above-identified patent and that said Letters Patent is hereby corrected as shown below:

Column 2,
Line 36, before "which", insert -- in --.
Line 41, after "arrangement", insert -- of --.

Signed and Sealed this

Twenty-second Day of April, 2003

JAMES E. ROGAN
*Director of the United States Patent and Trademark Office*